(12) United States Patent  (10) Patent No.: US 9,083,182 B2
Sato  (45) Date of Patent: Jul. 14, 2015

(54) BYPASS CAPACITORS FOR HIGH VOLTAGE BIAS POWER IN THE MID FREQUENCY RF RANGE

(71) Applicant: LAM RESEARCH CORPORATION, Fremont, CA (US)

(72) Inventor: Arthur Sato, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 184 days.

(21) Appl. No.: 13/684,065

(22) Filed: Nov. 21, 2012

(65) Prior Publication Data

US 2013/0128397 A1    May 23, 2013

Related U.S. Application Data

(60) Provisional application No. 61/563,526, filed on Nov. 23, 2011.

(51) Int. Cl.
*H01T 23/00* (2006.01)
*H02H 3/46* (2006.01)
*H05F 3/00* (2006.01)
*H01J 37/32* (2006.01)
*H01L 21/67* (2006.01)
*H01L 21/687* (2006.01)
*H01L 21/683* (2006.01)

(52) U.S. Cl.
CPC ............ *H02H 3/46* (2013.01); *H01J 37/32174* (2013.01); *H01J 37/32944* (2013.01); *H01L 21/67069* (2013.01); *H01L 21/6831* (2013.01); *H01L 21/68742* (2013.01); *H05F 3/00* (2013.01); *H01L 21/6833* (2013.01)

(58) Field of Classification Search
USPC .................................................. 361/234, 230
See application file for complete search history.

(56) References Cited

U.S. PATENT DOCUMENTS

| 4,340,462 A | 7/1982 | Koch |
| 5,183,990 A | 2/1993 | Enyedy |
| 5,304,250 A | 4/1994 | Sameshima et al. |
| 5,349,271 A | 9/1994 | Van Os et al. |
| 5,620,524 A | 4/1997 | Fan et al. |

(Continued)

FOREIGN PATENT DOCUMENTS

| EP | 1 155 164 B1 | 7/2010 |
| JP | 5166595 | 7/1993 |

(Continued)

OTHER PUBLICATIONS

PCT International Search Report—PCT/US2011/001175—dated Nov. 29, 2011 (2 pages).

(Continued)

*Primary Examiner* — Danny Nguyen
(74) *Attorney, Agent, or Firm* — Martine Penilla Group, LLP

(57) ABSTRACT

A system for decoupling arcing RF signals in a plasma chamber including a top electrode, an electrostatic chuck for supporting a semiconductor wafer, and a capacitor coupled between the at least one of a plurality of clamping electrodes in the surface of the electrostatic chuck and a baseplate of the electrostatic chuck, the capacitor having a capacitance of greater than about 19 nanofarads, the capacitor disposed within an interior volume of the electrostatic chuck. A method of decoupling arcing RF signals in a plasma chamber is also disclosed.

16 Claims, 15 Drawing Sheets

(56) References Cited

U.S. PATENT DOCUMENTS

| | | | |
|---|---|---|---|
| 5,968,587 A | 10/1999 | Frankel | |
| 5,998,933 A | 12/1999 | Shun'ko | |
| 6,023,405 A | 2/2000 | Shamouilian et al. | |
| 6,150,628 A | 11/2000 | Smith et al. | |
| 6,264,788 B1 | 7/2001 | Tomoyasu et al. | |
| 6,302,964 B1 | 10/2001 | Umotoy et al. | |
| 6,302,965 B1 | 10/2001 | Umotoy et al. | |
| 6,335,293 B1 | 1/2002 | Luo et al. | |
| 6,337,460 B2 | 1/2002 | Kelkar et al. | |
| 6,392,351 B1 | 5/2002 | Shun'ko | |
| 6,432,260 B1 | 8/2002 | Mahoney et al. | |
| 6,494,958 B1 * | 12/2002 | Shamouilian et al. | 118/728 |
| 6,527,911 B1 | 3/2003 | Yen et al. | |
| 6,528,751 B1 | 3/2003 | Hoffman et al. | |
| 6,557,248 B1 | 5/2003 | Shamouilian et al. | |
| 6,646,233 B2 | 11/2003 | Kanno et al. | |
| 6,825,618 B2 | 11/2004 | Pu et al. | |
| 6,855,906 B2 | 2/2005 | Brailove | |
| 6,872,259 B2 | 3/2005 | Strang | |
| 6,924,455 B1 | 8/2005 | Chen et al. | |
| 7,363,876 B2 | 4/2008 | Lai et al. | |
| 7,393,432 B2 | 7/2008 | Dhindsa et al. | |
| 7,581,511 B2 | 9/2009 | Mardian et al. | |
| 7,619,179 B2 | 11/2009 | Hayashi | |
| 7,683,289 B2 | 3/2010 | Dhindsa et al. | |
| 7,829,815 B2 | 11/2010 | Chen et al. | |
| 8,056,503 B2 | 11/2011 | Kikuchi et al. | |
| 8,485,128 B2 | 7/2013 | Kellogg et al. | |
| 8,522,716 B2 | 9/2013 | Kadkhodayan et al. | |
| 8,618,446 B2 | 12/2013 | Chang et al. | |
| 8,674,255 B1 | 3/2014 | Lenz et al. | |
| 8,906,197 B2 | 12/2014 | Dhindsa | |
| 2001/0000104 A1 | 4/2001 | Li et al. | |
| 2001/0002582 A1 | 6/2001 | Dunham et al. | |
| 2001/0047760 A1 | 12/2001 | Moslehi | |
| 2002/0170881 A1 | 11/2002 | Benzing et al. | |
| 2002/0197402 A1 | 12/2002 | Chiang et al. | |
| 2003/0000473 A1 | 1/2003 | Chae et al. | |
| 2003/0015965 A1 | 1/2003 | Godyak | |
| 2003/0027428 A1 | 2/2003 | Ng et al. | |
| 2003/0029567 A1 | 2/2003 | Dhindsa et al. | |
| 2003/0031794 A1 | 2/2003 | Tada et al. | |
| 2003/0071035 A1 | 4/2003 | Brailove | |
| 2003/0094903 A1 | 5/2003 | Tao et al. | |
| 2003/0098372 A1 | 5/2003 | Kim | |
| 2003/0136766 A1 | 7/2003 | Hoffman et al. | |
| 2003/0188685 A1 | 10/2003 | Wang et al. | |
| 2004/0003777 A1 | 1/2004 | Carpenter et al. | |
| 2004/0027781 A1 | 2/2004 | Hanawa et al. | |
| 2004/0040502 A1 | 3/2004 | Basceri et al. | |
| 2004/0040503 A1 | 3/2004 | Basceri et al. | |
| 2004/0047720 A1 | 3/2004 | Lerner et al. | |
| 2004/0083961 A1 | 5/2004 | Basceri | |
| 2004/0149699 A1 | 8/2004 | Hofman et al. | |
| 2004/0175953 A1 | 9/2004 | Ogle | |
| 2004/0178180 A1 | 9/2004 | Kaji et al. | |
| 2004/0226507 A1 | 11/2004 | Carpenter et al. | |
| 2005/0000655 A1 | 1/2005 | Wi | |
| 2005/0001556 A1 | 1/2005 | Hoffman et al. | |
| 2005/0006028 A1 | 1/2005 | Keil et al. | |
| 2005/0023254 A1 | 2/2005 | Hayashi et al. | |
| 2005/0087302 A1 | 4/2005 | Mardian et al. | |
| 2005/0160985 A1 | 7/2005 | Brcka | |
| 2005/0184670 A1 | 8/2005 | Lacoste et al. | |
| 2005/0194100 A1 | 9/2005 | Or et al. | |
| 2005/0217582 A1 | 10/2005 | Kim et al. | |
| 2005/0264218 A1 | 12/2005 | Dhindsa et al. | |
| 2005/0268856 A1 | 12/2005 | Miller et al. | |
| 2006/0060302 A1 | 3/2006 | White et al. | |
| 2006/0065623 A1 | 3/2006 | Guiney et al. | |
| 2006/0075969 A1 * | 4/2006 | Fischer | 118/725 |
| 2006/0081564 A1 | 4/2006 | Moroz et al. | |
| 2006/0118518 A1 | 6/2006 | Rusu et al. | |
| 2006/0237138 A1 | 10/2006 | Qin | |
| 2007/0081295 A1 | 4/2007 | Brillhart et al. | |
| 2007/0170155 A1 | 7/2007 | Fink | |
| 2007/0193688 A1 | 8/2007 | Dhindsa et al. | |
| 2007/0199658 A1 | 8/2007 | Dhindsa et al. | |
| 2007/0235420 A1 | 10/2007 | Yamazawa | |
| 2007/0235426 A1 | 10/2007 | Matsumoto et al. | |
| 2007/0251642 A1 | 11/2007 | Bera et al. | |
| 2008/0020574 A1 | 1/2008 | Marakhtanov et al. | |
| 2008/0041820 A1 | 2/2008 | Tong et al. | |
| 2008/0173237 A1 | 7/2008 | Collins et al. | |
| 2008/0179007 A1 | 7/2008 | Collins et al. | |
| 2008/0274297 A1 | 11/2008 | Furuta et al. | |
| 2008/0286697 A1 | 11/2008 | Verhaverbeke et al. | |
| 2008/0302652 A1 | 12/2008 | Entley et al. | |
| 2008/0302781 A1 | 12/2008 | Murakami et al. | |
| 2009/0025879 A1 | 1/2009 | Rauf et al. | |
| 2009/0066315 A1 | 3/2009 | Hu et al. | |
| 2009/0109595 A1 | 4/2009 | Herchen et al. | |
| 2009/0200268 A1 | 8/2009 | Tappan et al. | |
| 2009/0200269 A1 | 8/2009 | Kadkhodayan et al. | |
| 2009/0242135 A1 | 10/2009 | Koshimizu et al. | |
| 2009/0272492 A1 | 11/2009 | Katz et al. | |
| 2009/0277585 A1 | 11/2009 | Maebashi et al. | |
| 2009/0305509 A1 | 12/2009 | Stevenson et al. | |
| 2009/0321019 A1 | 12/2009 | Chen et al. | |
| 2010/0008015 A1 * | 1/2010 | Booth et al. | 361/234 |
| 2010/0008016 A1 | 1/2010 | Onate et al. | |
| 2010/0065215 A1 | 3/2010 | Jeon et al. | |
| 2010/0072172 A1 | 3/2010 | Ui et al. | |
| 2010/0098875 A1 | 4/2010 | Fischer et al. | |
| 2010/0116788 A1 | 5/2010 | Singh et al. | |
| 2010/0116790 A1 | 5/2010 | Spitzl | |
| 2010/0140223 A1 | 6/2010 | Tyler et al. | |
| 2010/0147050 A1 | 6/2010 | Barth | |
| 2010/0196626 A1 | 8/2010 | Choi et al. | |
| 2010/0319852 A1 | 12/2010 | Brillhart et al. | |
| 2011/0061687 A1 | 3/2011 | Mikhaylichenko et al. | |
| 2011/0075313 A1 | 3/2011 | Comendant | |
| 2011/0108524 A1 | 5/2011 | Dhindsa et al. | |
| 2012/0055632 A1 | 3/2012 | de la Llera et al. | |
| 2012/0086541 A1 | 4/2012 | Kester | |
| 2013/0023064 A1 | 1/2013 | Marakhtanov et al. | |
| 2013/0059448 A1 | 3/2013 | Marakhtanov et al. | |
| 2013/0126475 A1 | 5/2013 | Dhindsa et al. | |
| 2013/0127124 A1 | 5/2013 | Nam et al. | |
| 2013/0133834 A1 | 5/2013 | Dhindsa | |
| 2013/0260567 A1 | 10/2013 | Marakhtanov et al. | |
| 2014/0054268 A1 | 2/2014 | Chen et al. | |
| 2014/0054269 A1 | 2/2014 | Hudson et al. | |
| 2014/0065835 A1 | 3/2014 | Kadkhodayan et al. | |
| 2014/0087488 A1 | 3/2014 | Nam et al. | |

FOREIGN PATENT DOCUMENTS

| | | |
|---|---|---|
| JP | 5144594 | 11/1993 |
| RU | 2022917 | 11/1994 |
| RU | 2056702 | 3/1996 |
| RU | 2094961 | 10/1997 |
| TW | 201043099 A | 12/2010 |
| WO | WO 01 36703 A1 | 5/2001 |

OTHER PUBLICATIONS

PCT International Search Report—PCT/US2011/001174 dated Dec. 6, 2011 (2 pages).

PCT International Search Report—PCT/US2011/001176—dated Jan. 19, 2012 (4 pages).

PCT International Search Report—PCT/US2012/065333—(dated Jan. 28, 2013) (3 pages).

PCT International Search Report—PCT/US2012/063987(dated Jan. 28, 2013) (3 pages).

PCT International Search Report—PCT/US2012/065080(dated Jan. 28, 2013) (2 pages).

(56) References Cited

OTHER PUBLICATIONS

PCT International Search Report—PCT/US2012/065684 (dated Jan. 28, 2013) (2 pages).
PCT International Search Report—PCT/US2012/65949 (dated Feb. 5, 2013) (2 pages).
PCT International Search Report—PCT/US2012/065677 (dated Feb. 7, 2013 (3 pages).
PCT International Search Report—PCT/US2012/66467 (dated Feb. 8, 2013) (2 pages).
PCT International Search Report—PCT/US2012/65122—(dated Mar. 25, 2013) (2 pages).
ISR PCT/US2012/066425 dated Feb. 22, 2013.
Taiwan Search Report, App. No. 101144019, of Notification of Examination Opinions, 7 pages, issued Sep. 22, 2014.

* cited by examiner

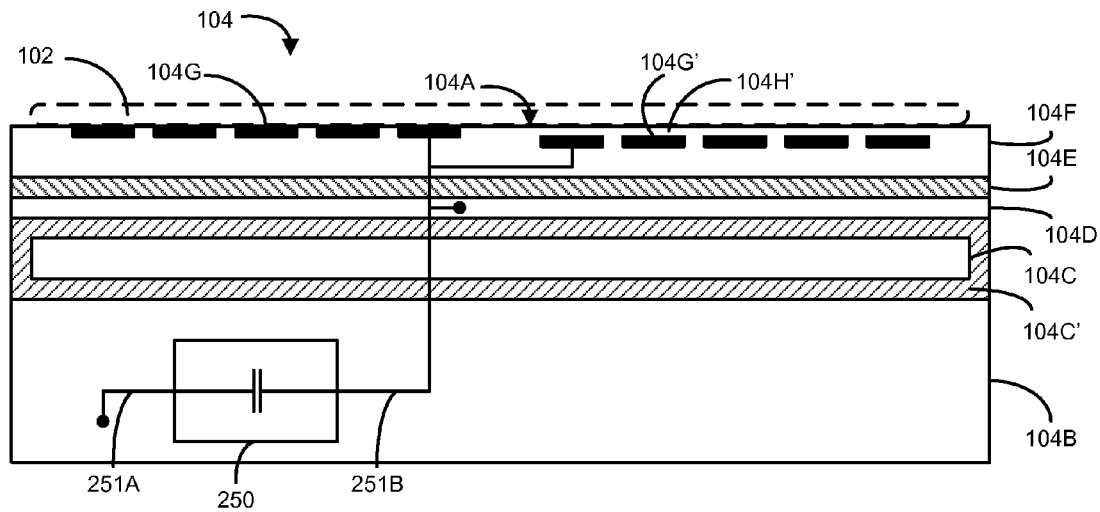
FIG. 2A
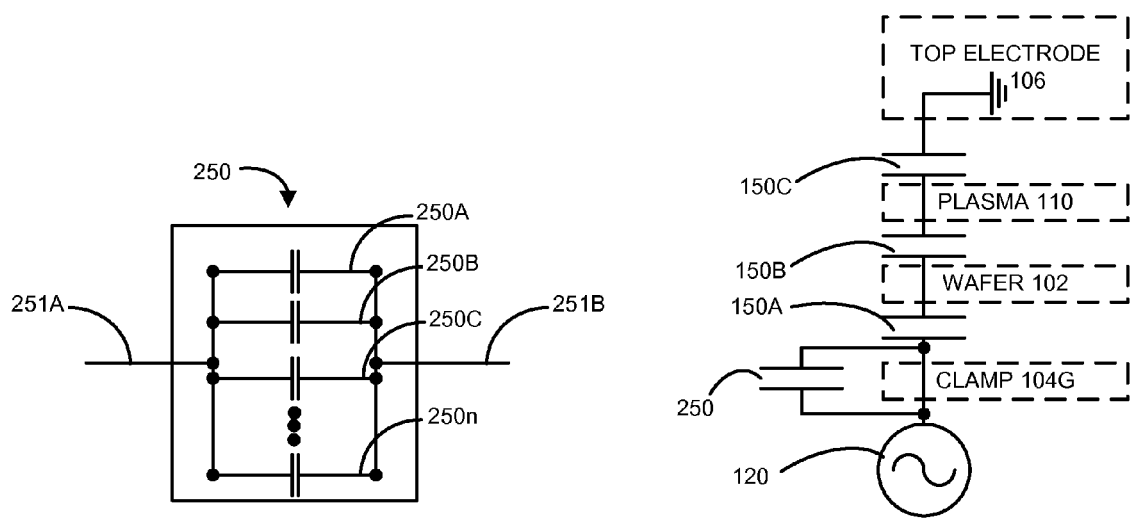
FIG. 2B  FIG. 2C

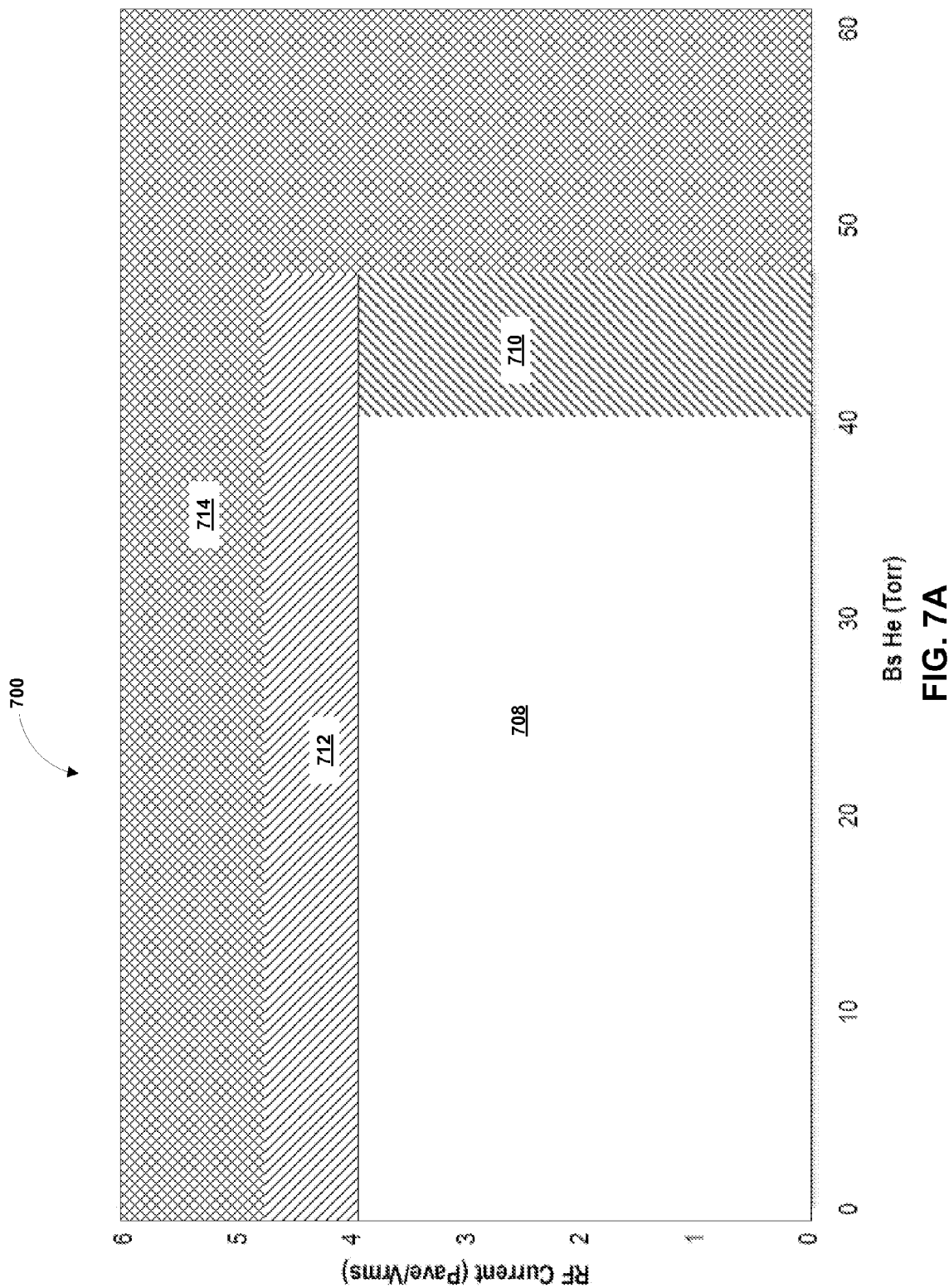

the following detailed description in conjunction with the accompanying drawings, illustrating by way of example the principles of the invention.

BYPASS CAPACITORS FOR HIGH VOLTAGE BIAS POWER IN THE MID FREQUENCY RF RANGE

CROSS REFERENCE TO RELATED APPLICATIONS

This application claims priority from U.S. Provisional Patent Application No. 61/563,526 filed on Nov. 23, 2011 and entitled "Bypass Capacitors for High Voltage Bias Power in the Mid Frequency RF Range," which is incorporated herein by reference in its entirety for all purposes. This application is related to U.S. patent application Ser. No. 13/301,580, filed Nov. 21, 2011, entitled "System, Method and Apparatus for Detecting DC Bias in a Plasma Processing Chamber," and to U.S. patent application Ser. No. 13/301,725, filed Nov. 21, 2011, entitled "TRIODE REACTOR DESIGN WITH MULTIPLE RADIOFREQUENCY POWERS," and to U.S. Provisional Patent Application No. 61/563,021, filed Nov. 22, 2011, entitled "SYSTEMS AND METHODS FOR CONTROLLING A PLASMA EDGE REGION," the disclosures of which are incorporated herein by reference for all purposes. This application is also related to U.S. Provisional Patent Application No. 61/563,510, filed Nov. 23, 2011, entitled "Dual zone temperature control of upper electrodes" which is incorporated by reference herein for all purposes.

The present invention relates generally to plasma processing chambers, and more particularly, to systems, methods and apparatus for preventing plasma light up around the lift pins in the electrostatic chuck.

Plasma processing is very common in manufacturing semiconductors. Plasma processing is typically a plasma etch process where plasma ions produced in the plasma react with an exposed layer of the substrate. The depth the plasma ions can penetrate into the exposed layer of the substrate is determined by the energy of the plasma ions. The energy of the plasma ions is at least partially related to the bias applied to the substrate.

Ever higher aspect ratios of depth/width are sought as semiconductor device sizes become smaller and more densely packed. The higher aspect ratios require plasma ions with an increased energy level.

One approach to increasing the energy of the plasma ions is to increase the bias voltage. Unfortunately, as the bias voltage increases, arcing occurs between the substrate and the processing chamber and between the electrodes and the processing chamber structures and the lift pins.

The lift pins and adjacent structures can be damaged by arcing as the bias levels increase. In view of the foregoing, there is a need for a system, method and apparatus for more preventing arcing on the lift pins in a plasma processing chamber.

SUMMARY

Broadly speaking, the present invention fills these needs by providing a system and method for decoupling arcing RF signals in a plasma chamber. It should be appreciated that the present invention can be implemented in numerous ways, including as a process, an apparatus, a system, computer readable media, or a device. Several inventive embodiments of the present invention are described below.

One embodiment provides a system for decoupling arcing RF signals in a plasma chamber including a top electrode, an electrostatic chuck for supporting a semiconductor wafer, and a capacitor coupled between the at least one of a plurality of clamping electrodes in the surface of the electrostatic chuck and a baseplate of the electrostatic chuck, the capacitor having a capacitance of greater than about 19 nanofarads, the capacitor disposed within an interior volume of the electrostatic chuck.

The system can also include multiple lift pins supported in corresponding lift pin holes in the surface of the electrostatic chuck. Each one of the lift pins can have a clearance of less than about 0.011 inches (0.25 mm) between a corresponding side in a corresponding lift pin hole. Each one of the lift pins can have a clearance of less than about 0.005 inches (0.12 mm) between a corresponding side in a corresponding lift pin hole. At least one of the lift pins can be a round-tip lift pin, a flat tip lift pin and/or a broadened flat tip lift pin. The capacitor can have a capacitance of between about 19 nanofarads and about 43 nanofarads.

Another embodiment provides a method of decoupling arcing RF signals in a plasma chamber including generating a plasma in the region between a top electrode and a top surface of an electrostatic chuck in a plasma chamber including applying one or more RF signals to one or both of the top electrode and the electrostatic chuck. A semiconductor wafer is supported on the top surface of an electrostatic chuck. A portion of the one or more RF signals are coupled through a capacitor coupled between a clamping electrode in the top surface of the electrostatic chuck and a baseplate of the electrostatic chuck. The capacitor has a capacitance of at least 19 nanofarads. The capacitor disposed within an interior volume of the electrostatic chuck.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

FIG. 2A is a simplified cross sectional view of the electrostatic chuck, in accordance with embodiments of the present invention.

FIG. 2B is a schematic diagram of a parallel array of capacitors, in accordance with embodiments of the present invention.

FIG. 2C is a simplified schematic of the equivalent capacitances and the additional capacitor in the plasma chamber, in accordance with embodiments of the present invention.

FIG. 7A is a graph of the operational area of an exemplary plasma chamber 101, in accordance with an embodiment of the present invention.

DETAILED DESCRIPTION

Several exemplary embodiments for a system, method and apparatus for more preventing arcing in the lift pins will now be described. It will be apparent to those skilled in the art that the present invention may be practiced without some or all of the specific details set forth herein.

At near 1000 volts at 400 kilohertz measured at the electrostatic chuck, light up and arcing can occur on the back side of the substrate support on the lift pins and the electrostatic chuck. This high-voltage regimen is useful for high oxide etch rate applications.

Adding additional capacitance in excess of 19 nanofarads between electrostatic chuck base and the poles reduces the voltage dramatically and allows high bias voltage operation without backside light up and arcing.

Typical methods rely on shielding the lifter pin holes with dielectric sleeves and plugging the helium holes in the electrostatic chuck with ceramic to suppress light up. The typical methods fail to allow greater than about 900 volts operation and still prevent arcing.

Maximizing the capacitance between the electrostatic chuck base and the poles is difficult due to the physical dimensions, environmental concerns and limitations of providing this capacitance in the interior volume of the electrostatic chuck. A 22 nanofarad capacitor array can be used. Ideally, an even greater capacitance is also desirable. By way of example, a 43 nanofarad capacitor array could be used.

Figure 1A:
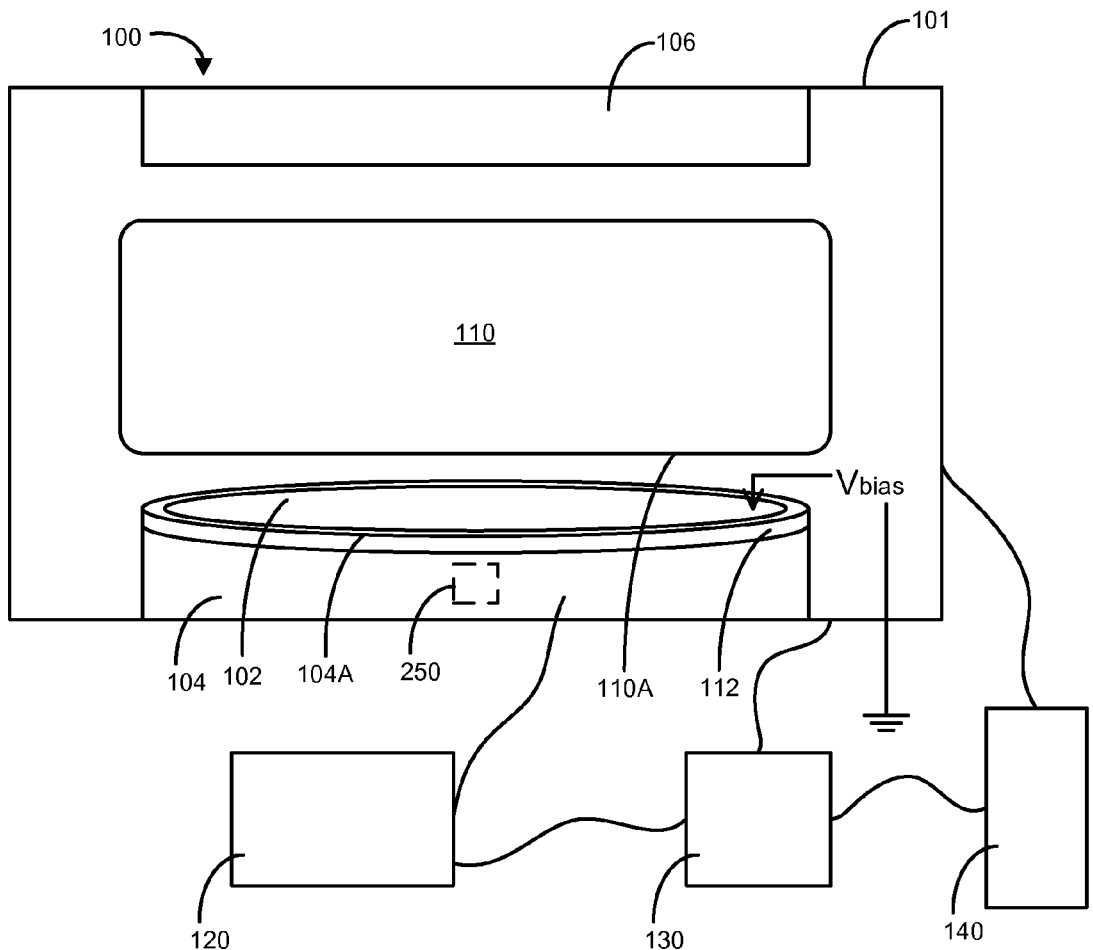
FIG. 1A is a block diagram of a plasma chamber system, in accordance with embodiments of the present invention.

FIG. 1A is a block diagram of a plasma chamber system 100, in accordance with embodiments of the present invention. The plasma chamber system 100 includes a plasma chamber 101, an electrostatic chuck (ESC) 104, an edge ring 112 in the top surface of the ESC 104, and a top electrode 106. The top electrode 106 and the ESC 104 can be coupled to one or more respective RF signal sources 120 or ground potentials as desired for the specific process. A process gas supply 140 is also coupled to the plasma chamber 101. The electrostatic chuck 104 includes an additional capacitor 250 as will be described in more detail below.

A controller 130 is also coupled to the plasma chamber 101 and the one or more RF signal sources 120 and the process gas supply 140. The controller 130 includes software, logic, memory systems, input and output systems to monitor control the system 100 according to a desired recipe or process. The input and output systems include user interface systems for interacting with a user. The input and output systems also include networking protocols for communicating data to and from other computer systems and peripherals (e.g., displays, printers, remote storage and other input and output devices). The controller 130 can be a standard, i.e., generic computer, or a suitable specialized computer for the specific application.

The electro-static chuck (ESC) 104 is capable of supporting and securing a semiconductor wafer 102 on a surface 104A. The one or more RF signal sources 120 can also include one or more DC bias sources.

Figure 1B:
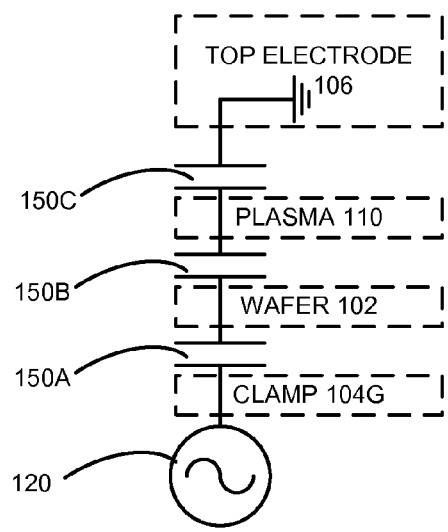
FIG. 1B is a simplified schematic of the equivalent capacitances in the plasma chamber, in accordance with embodiments of the present invention.

FIG. 1B is a simplified schematic of the equivalent capacitances 150A, B, C in the plasma chamber 101, in accordance with embodiments of the present invention. Equivalent capacitor 150A is formed between the clamping electrodes 104G, 104G', shown in more detail in FIG. 2A, and the semiconductor wafer 102. Equivalent capacitor 150B is formed between the semiconductor wafer 102 and the plasma 110. Equivalent capacitor 150C is formed between the plasma 110 and the top electrode 106. The top electrode 106 is typically grounded.

FIG. 2A is a simplified cross sectional view of the electrostatic chuck 104, in accordance with embodiments of the present invention. Beginning with the base plate 104B and describing upward through the layers to the surface 104A, the electro-static chuck 104 includes the conductive base plate 104B, an insulated heater/cooling layer 104C mounted on the base plate, a conductive layer 104D mounted on the heater/cooling layer, an insulating layer 104E mounted on the conductive layer, and a ceramic top layer 104F. The ceramic top layer 104F includes multiple clamping electrodes 104G, 104G'. The heater/cooling layer 104C can include an insulator 104C' to insulate the heater/cooling layer from the adjacent layers 104B, 104D.

A first portion of the multiple clamping electrodes 104G' can be covered by a non-conductive, surface layer 104H'. Alternatively, a second portion 104G or all of the multiple clamping electrodes 104G and 104G' may be exposed on the top surface 104A of the electro-static chuck 104.

In operation, applying a bias voltage to the multiple clamping electrodes 104G and 104G' forms an electro-static attraction between a semiconductor wafer 102 and the top surface 104A of the electro-static chuck 104, thus clamping the semiconductor wafer in place on the top surface of the electrostatic chuck.

A capacitor 250 is included within the electro-static chuck 104. The capacitor 250 has a first electrical terminal leg 251A electrically coupled to at least a portion of or all of the multiple clamping electrodes 104G, 104G' of the electro-static chuck 104. A second electrical terminal leg 251B of the capacitor 250 is electrically coupled to at least one of the base plate 104B and/or a conductive layer 104D, of the electrostatic chuck 104.

The capacitor 250 can be a single capacitor or an array of multiple capacitors. The capacitor 250 has a capacitance of between about 19 nano-Farads and about 43 nano-Farads or more, in addition to the equivalent capacitances 150A, 150B, 150C described above.

FIG. 2B is a schematic diagram of a parallel array of capacitors 250A-n, in accordance with embodiments of the present invention. The capacitor 250 can be formed from multiple capacitors 250A-n coupled in parallel as shown. The number of capacitors is limited to the physical space in which the capacitors reside within the FIG. 2C is a simplified schematic of the equivalent capacitances 150A, B, C and the additional capacitor 250 in the plasma chamber 101, in accordance with embodiments of the present invention. The additional capacitor 250 is coupled in parallel with the electrostatic chuck 104 as described in more detail below. The additional capacitor 250 adds electrical capacitance to the plasma chamber 101, in addition to the equivalent capacitances 150A, B, C.

Figure 3A:
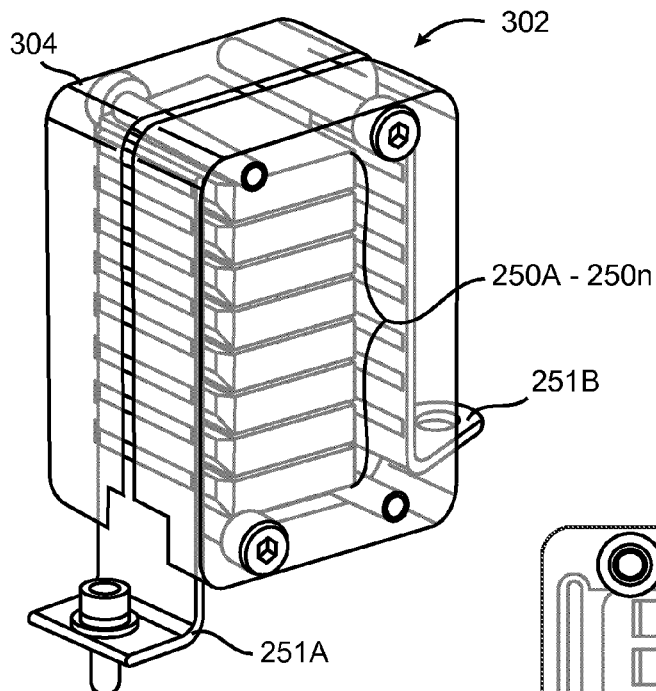
FIGS. 3A and 3B are perspective views of an encapsulated capacitor array, in accordance with embodiments of the present invention.
Figure 3B:
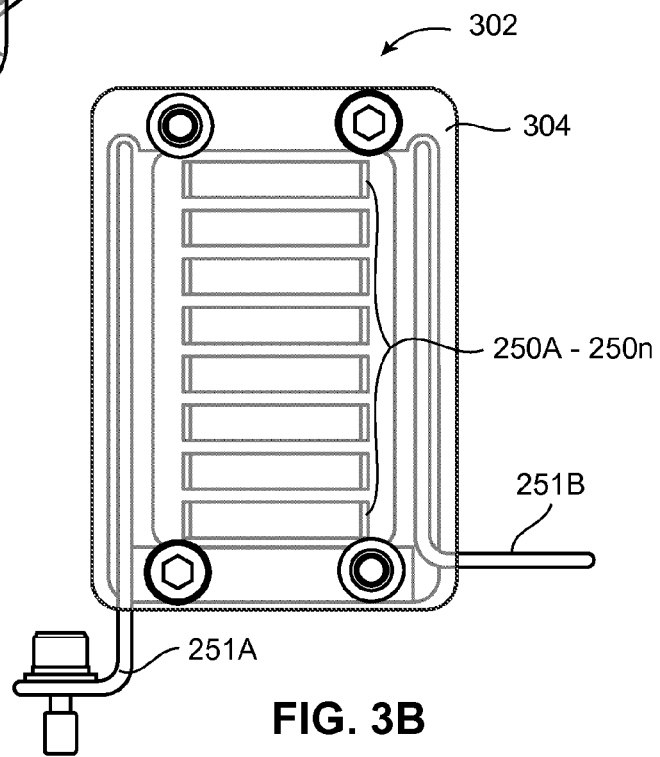

FIGS. 3A and 3B are perspective views of an encapsulated capacitor array 302, in accordance with embodiments of the present invention. The encapsulated capacitor array 302 includes a case 304 and the capacitor array having multiple capacitors 250A-250n. The actual number of multiple capacitors 250A-250n can vary from one to as many capacitors that will physically be contained with the case 304. The encapsulated capacitor array 302 includes a first electrical terminal leg 251A and a second electrical terminal leg 251B.

Figure 3C:
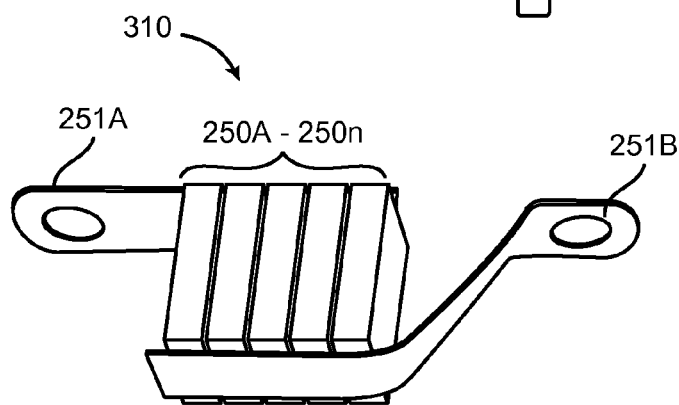
FIG. 3C is a perspective view of a capacitor array, in accordance with embodiments of the present invention.

FIG. 3C is a perspective view of a capacitor array 310, in accordance with embodiments of the present invention. The capacitor array 310 includes the capacitor array having multiple capacitors 250A-250n. The actual number of multiple capacitors 250A-250n can vary from one to as many capacitors that will physically be contained with the case 304. The capacitor array 310 includes a first electrical terminal leg 251A and a second electrical terminal leg 251B.

Figure 4A:
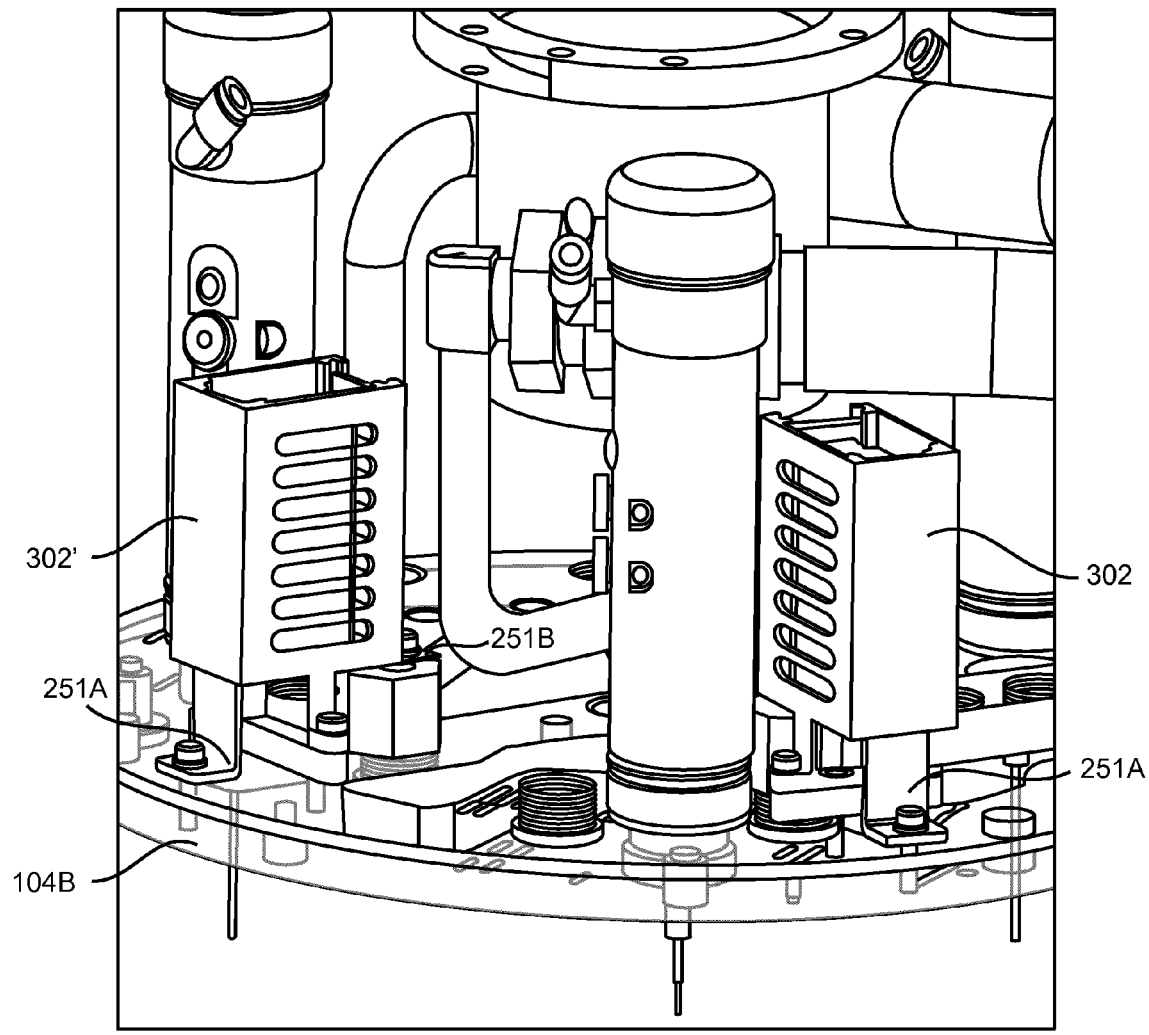
FIG. 4A is a perspective view of multiple encapsulated capacitor arrays mounted within the electrostatic chuck 104, in accordance with embodiments of the present invention.
Figure 4B:
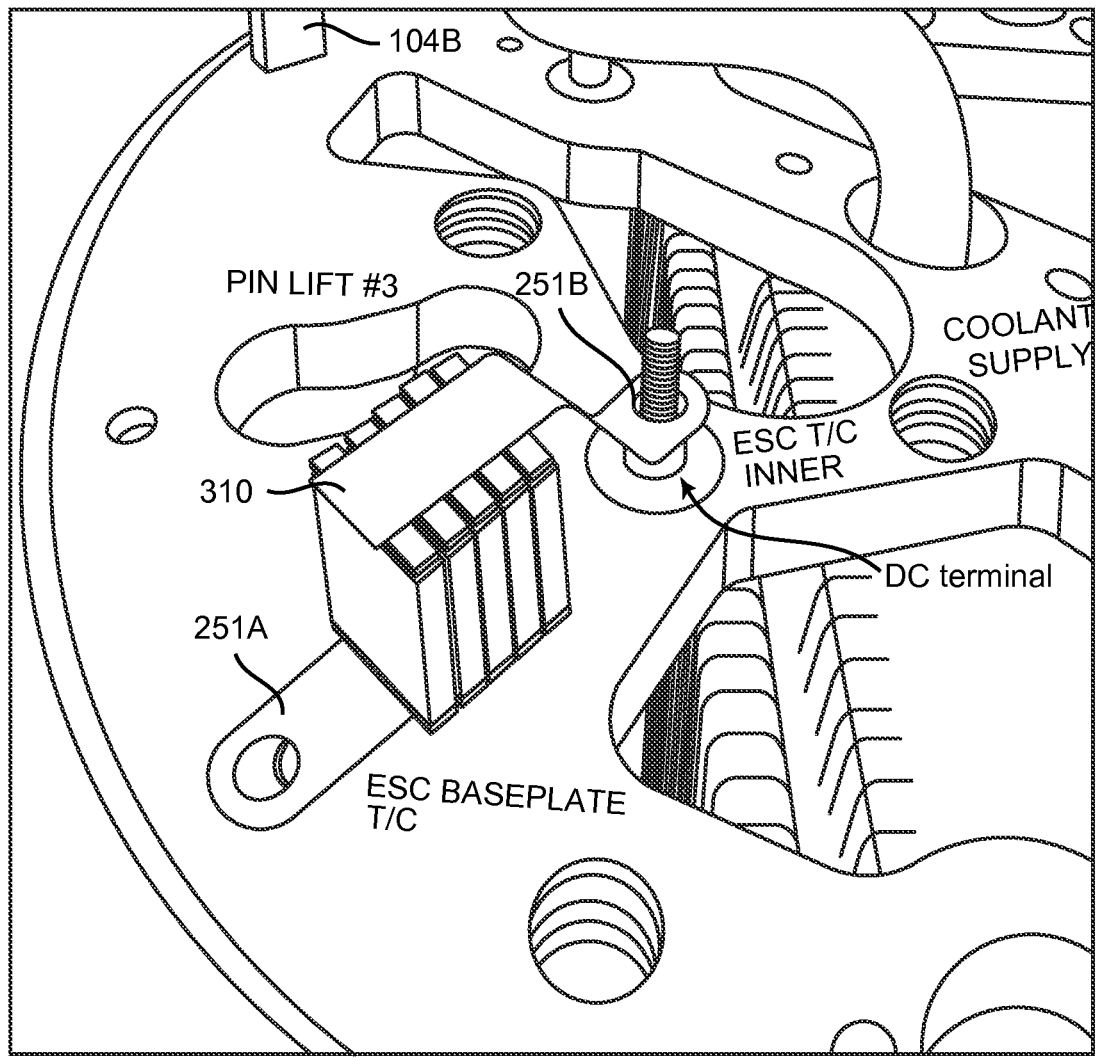
FIG. 4B is a perspective view of the capacitor array, mounted within the electrostatic chuck, in accordance with embodiments of the present invention.

FIG. 4A is a perspective view of multiple encapsulated capacitor arrays 302, 302' mounted within the electrostatic chuck 104, in accordance with embodiments of the present invention. FIG. 4B is a perspective view of the capacitor array 310, mounted within the electrostatic chuck 104, in accordance with embodiments of the present invention.

Figure 5A:
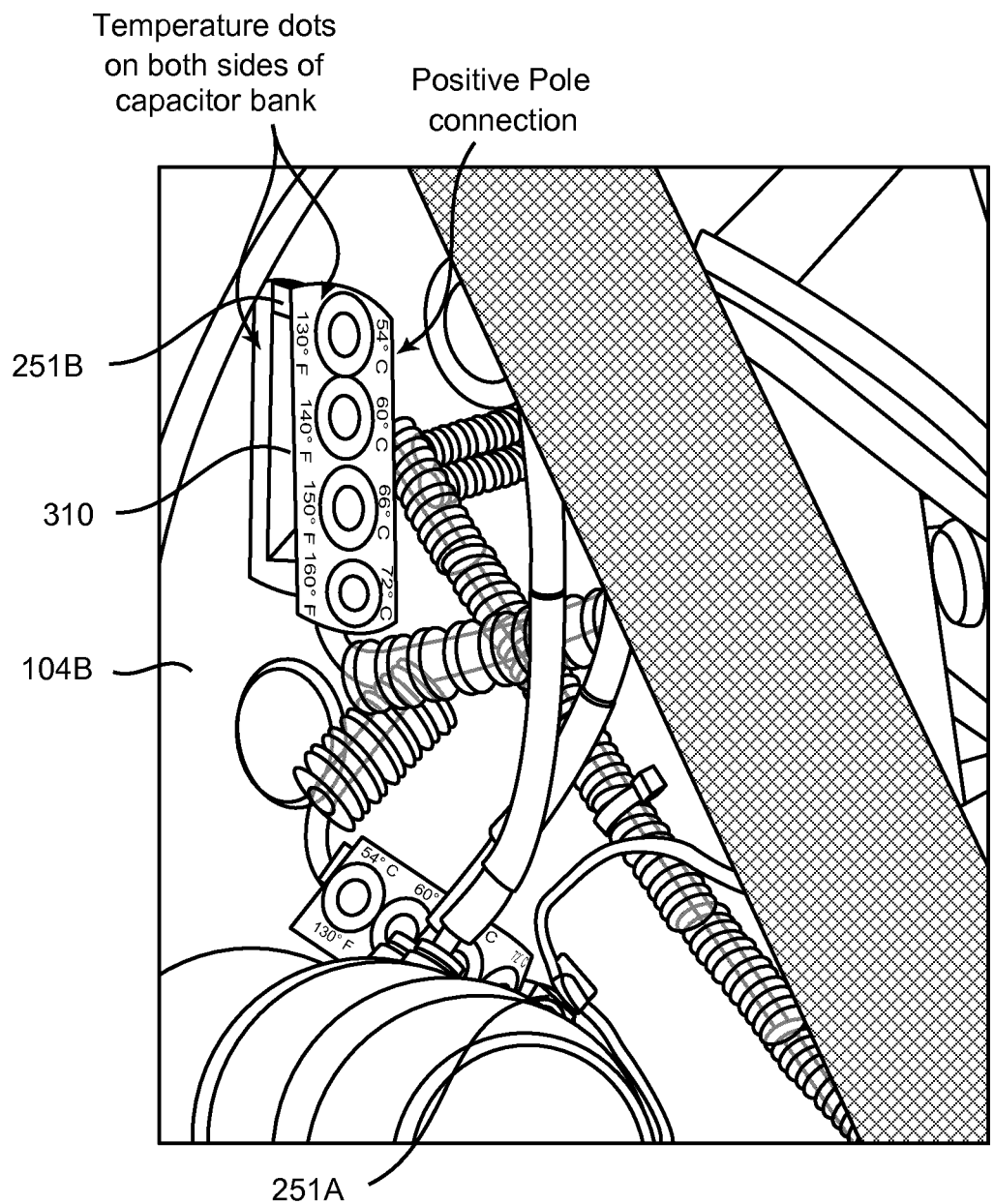
FIG. 5A is a detailed perspective view of a first electrical terminal leg coupled within the electrostatic chuck, in accordance with embodiments of the present invention.
Figure 5B:
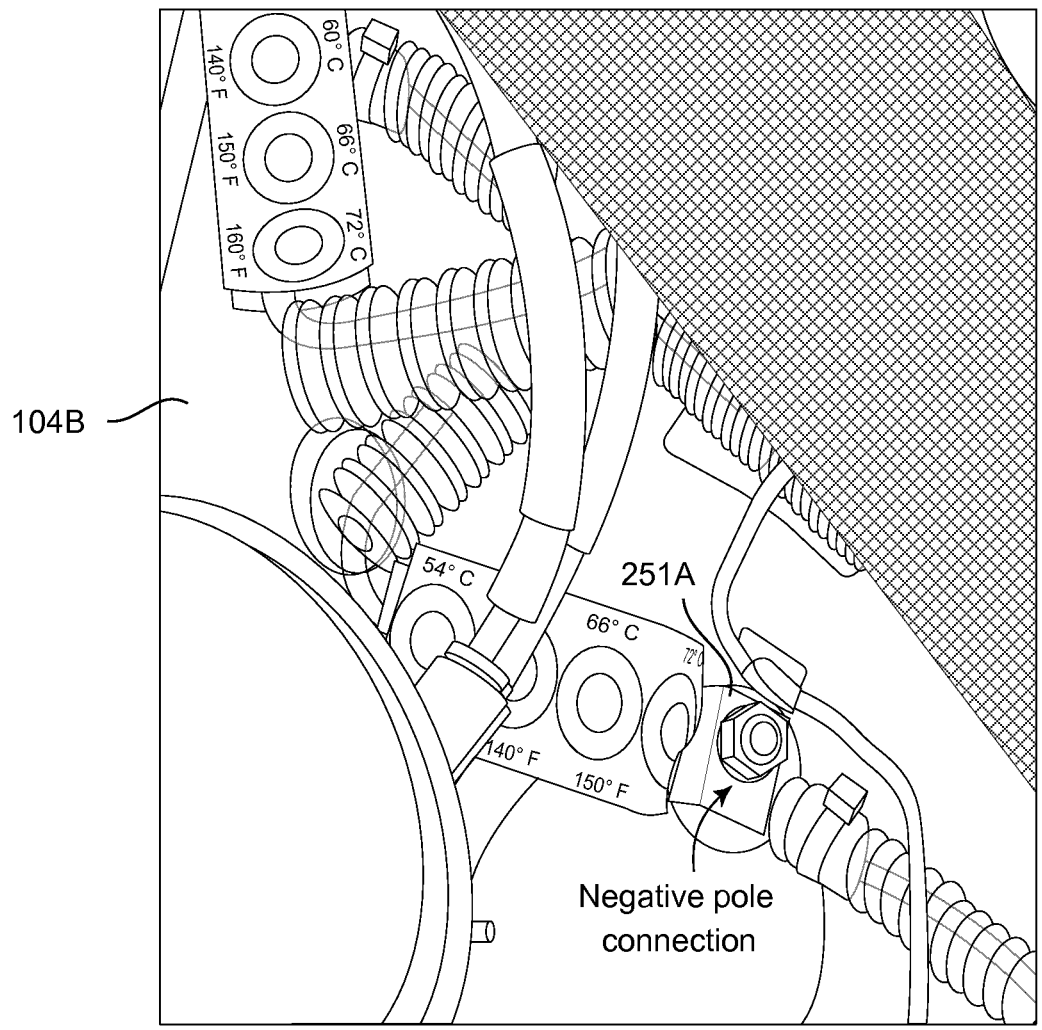
FIG. 5B is a detailed perspective view of a second electrical terminal leg coupled within the electrostatic chuck, in accordance with embodiments of the present invention.
Figure 5C:
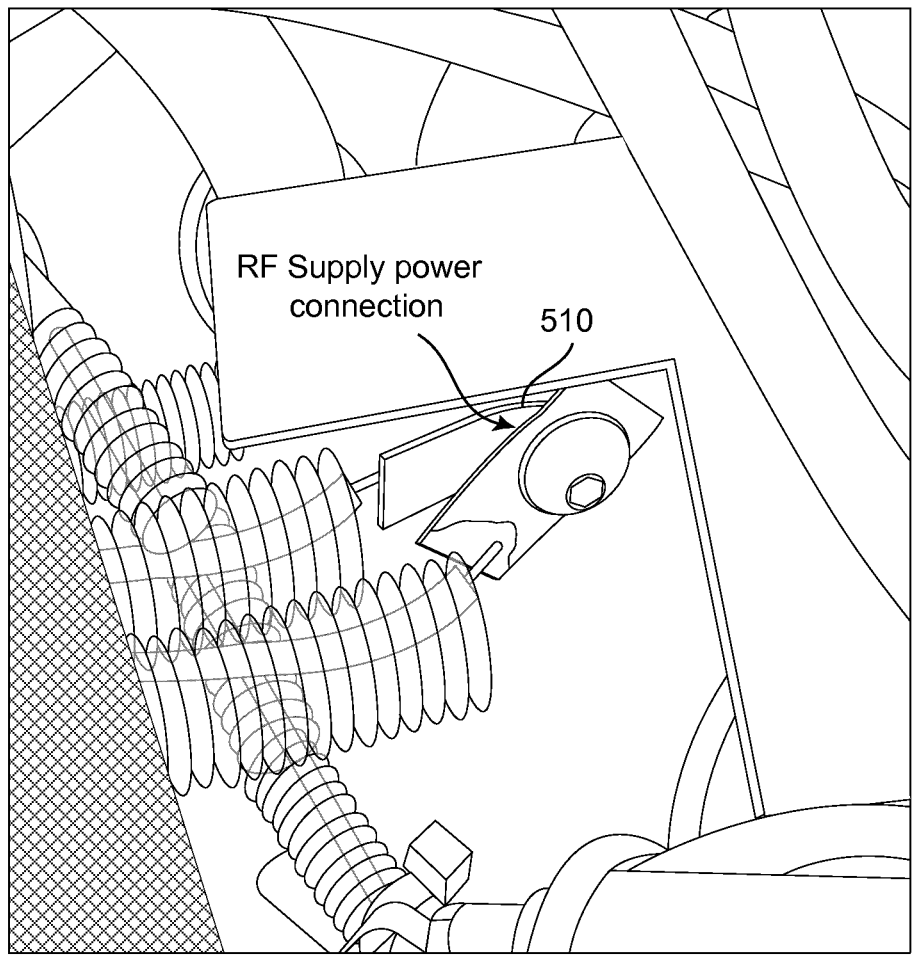
FIG. 5C is a detailed perspective view of a RF input connection from a RF signal source coupled within the electrostatic chuck, in accordance with embodiments of the present invention.

FIG. 5A is a detailed perspective view of a first electrical terminal leg 251A coupled within the electrostatic chuck 104, in accordance with embodiments of the present invention. FIG. 5B is a detailed perspective view of a second electrical terminal leg 251B coupled within the electrostatic chuck 104, in accordance with embodiments of the present invention. FIG. 5C is a detailed perspective view of a RF input connection 510 from a RF signal source 120 coupled within the electrostatic chuck 104, in accordance with embodiments of the present invention.

Figure 6A:
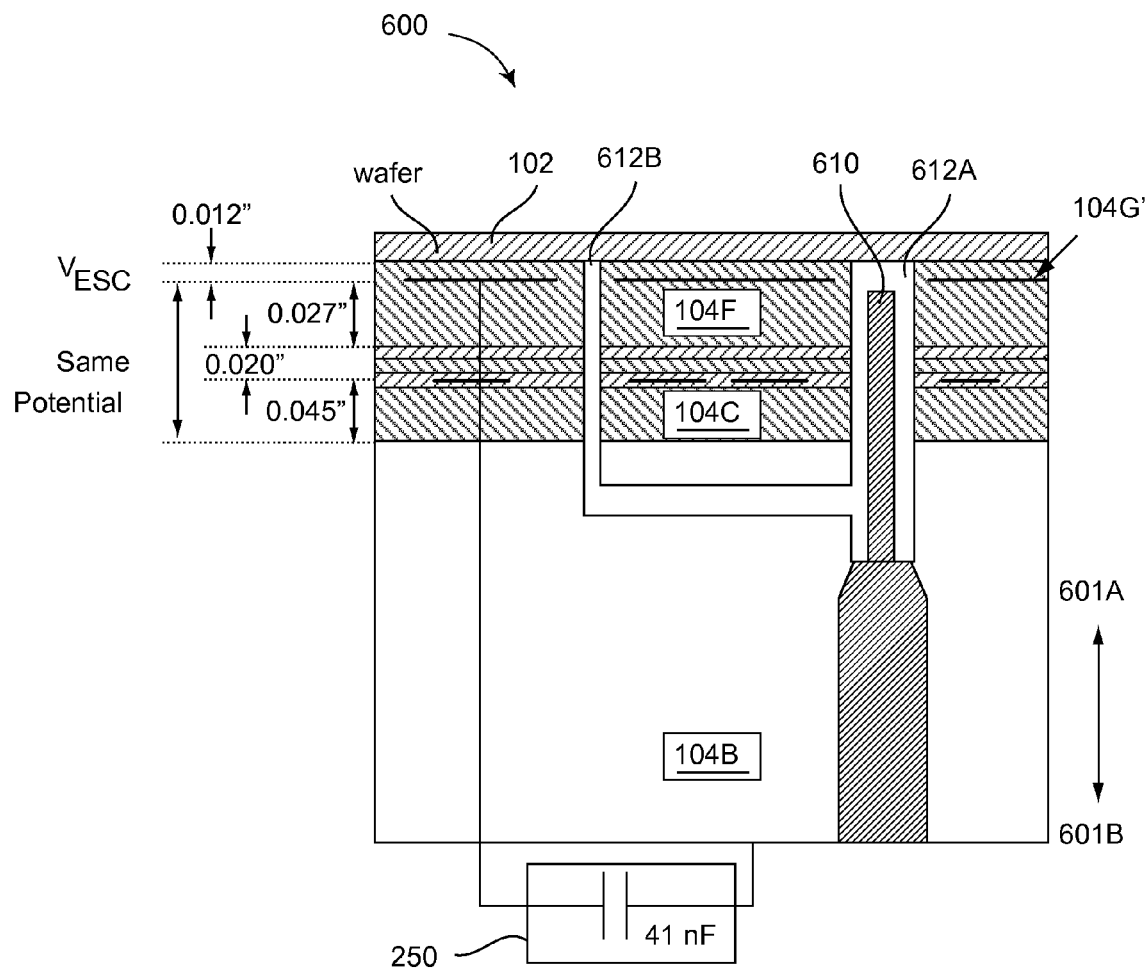
FIG. 6A is a detailed sectional view of a lift pin in an electrostatic chuck, in accordance with embodiments of the present invention.

FIG. 6A is a detailed sectional view 600 of a lift pin 610 in an electrostatic chuck, in accordance with embodiments of the present invention. The lift pin 610 is moved upward in direction 601A to lift the semiconductor wafer 102 and downward in direction 601B to lower the semiconductor wafer to the surface 104A of the electrostatic chuck 104. Helium or other inert cooling gas is flowed through the lift pin hole 612A and coolant hole 612B. The helium prevents process gases from entering the lift pin hole 612A and the coolant hole 612B. The helium also cools the semiconductor wafer 102 as the helium flows across between the semiconductor wafer and the top surface 104A of the electro-static chuck 104.

An excess voltage potential measured across the lift pin 610 to the clamping electrode 104G' can cause arcing that can damage the semiconductor wafer 102. The additional capacitor 250 coupled between the base plate 104B of the electrostatic chuck 104 and the clamping electrodes 104G'.

Excess clearance between the lift pin hole 612A and the lift pin 610 can also cause arcing. Different approaches to minimizing the clearance between the lift pin hole 612A and the lift pin 610 include using different shapes of lift pins. The lift pin 610 can be formed from any suitable material. Exemplary suitable lift pin materials include but are not limited to sapphire and nitanol.

Figure 6B:
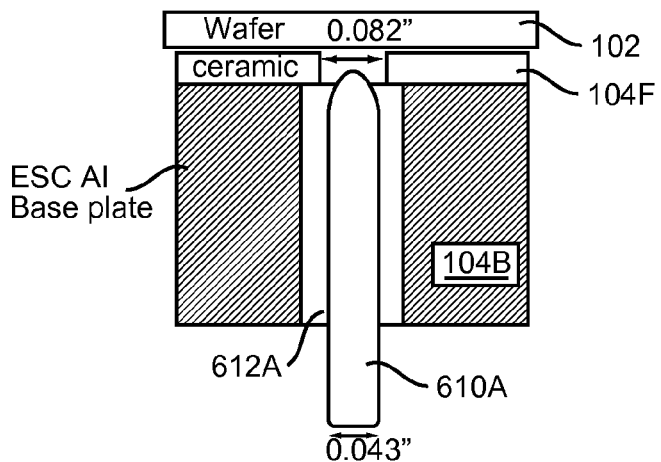
FIG. 6B is a detailed sectional view of a round-tip lift pin, in accordance with embodiments of the present invention.
Figure 6C:
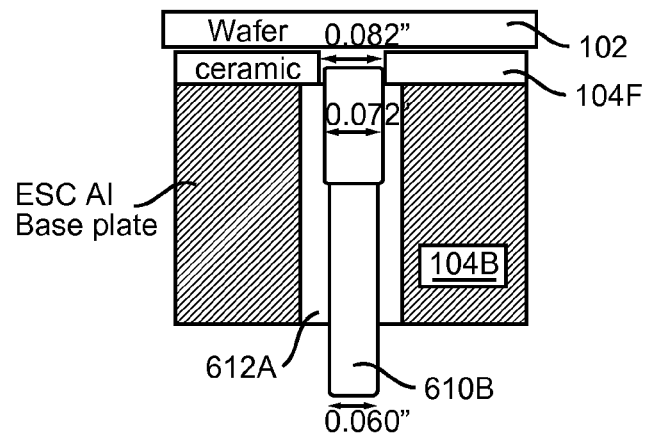
FIG. 6C is a detailed sectional view of a broadened flat tip lift pin, in accordance with embodiments of the present invention.
Figure 6D:
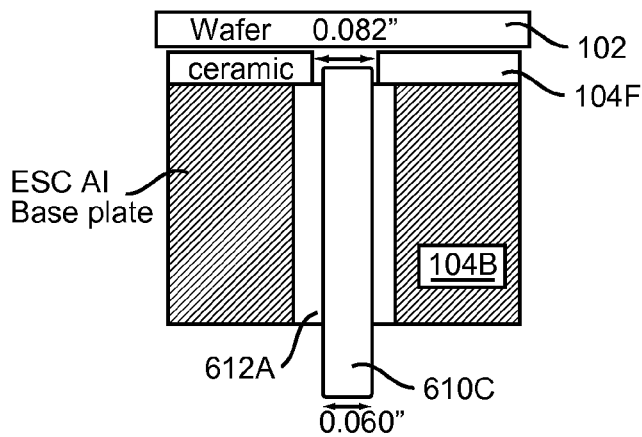
FIG. 6D is a detailed sectional view of a flat tip lift pin, in accordance with embodiments of the present invention.

FIG. 6B is a detailed sectional view 620 of a round-tip lift pin 610A, in accordance with embodiments of the present invention. FIG. 6C is a detailed sectional view 630 of a broadened flat tip lift pin 610B, in accordance with embodiments of the present invention. FIG. 6D is a detailed sectional view 640 of a flat tip lift pin 610C, in accordance with embodiments of the present invention. The lift pin hole 612A has a diameter slightly larger than the diameter of the lift pin 610.

By way of example, referring to FIG. 6B, the round-tip lift pin 610A has a diameter of about 0.043 inches (1.0 mm) and the lift pin hole 612A has a diameter of 0.082 inches (1.9 mm) As a result, a clearance between each side of the round-tip lift pin 610A to the corresponding side of the lift pin hole 612A of about 0.021 inches (0.5 mm)

The flat tip lift pin 610C of FIG. 6D has a diameter of 0.060 inches (1.5 mm) with the lift pin hole 612A having a diameter of 0.082 inches (1.9 mm) As a result, a clearance between each side of the flat tip lift pin 610C to the corresponding side of the lift pin hole 612A of about 0.011 inches (0.25 mm)

The broadened flat tip lift pin 610C of FIG. 6D has a shaft diameter of less than the diameter of the flat tip. By way of example the shaft diameter can be about 0.060" (1.5 mm) and the flat tip can have a diameter of 0.072 inches (1.7 mm) The lift pin hole 612A having a diameter of 0.082 inches (1.9 mm) As a result, a clearance between each side of the broadened flat tip lift pin 610B to the corresponding side of the lift pin hole 612A of about 0.005 inches (0.12 mm)

FIG. 7A is a graph 700 of the operational area 710 of an exemplary plasma chamber 101, in accordance with an embodiment of the present invention. The operation area 708 is an exemplary operating area without the additional capacitor 250. The additional operation areas 710 and 712 illustrate the extensions of the operational area 708 provided when the additional capacitor 250 is coupled between the base plate 104B and the clamping electrodes 104G, 104G'. Unsafe operational area is represented by the cross hatched area 714. The additional capacitor 250 extends the operational area in both pressure of the Helium and RF current. The pressure of the Helium can be extended from 40 Torr to about 48 Torr. The RF current is extended from about 3.9 Vrms to about 4.8 Vrms.

Figure 7B:
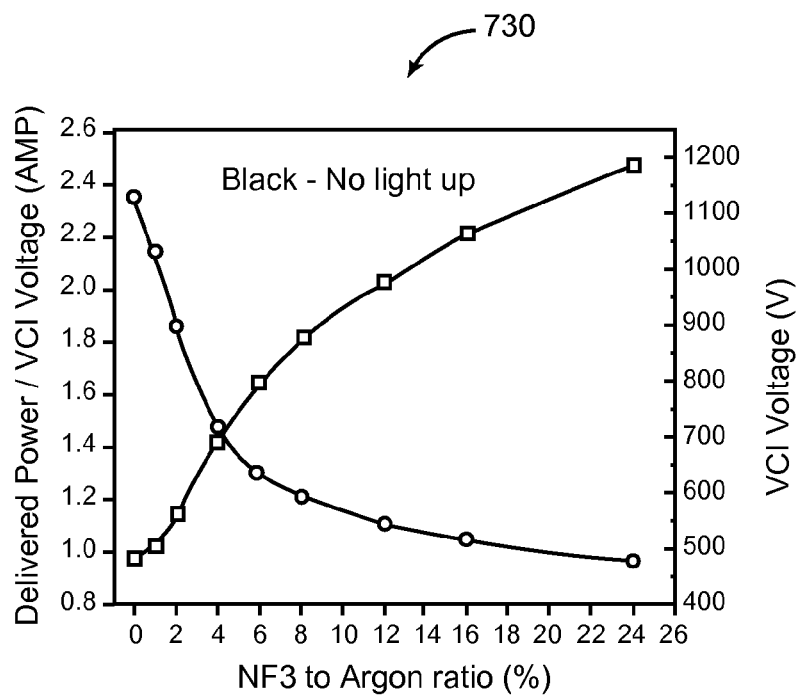
FIG. 7B is a graph of an exemplary plasma chamber without arcing (light up) with use of the additional capacitor, in accordance with an embodiment of the present invention.
Figure 7C:
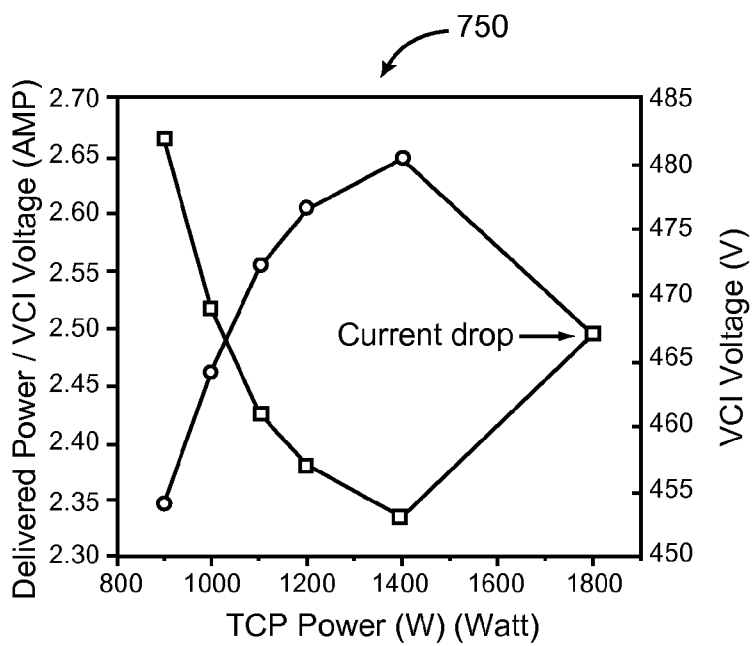
FIG. 7C is a graph of an exemplary plasma chamber showing the current drop with use of the additional capacitor, in accordance with an embodiment of the present invention.

FIG. 7B is a graph 730 of an exemplary plasma chamber 101 without arcing (light up) with use of the additional capacitor 250, in accordance with an embodiment of the present invention. FIG. 7C is a graph 750 of an exemplary plasma chamber 101 showing the current drop with use of the additional capacitor 250, in accordance with an embodiment of the present invention.

Figure 8:
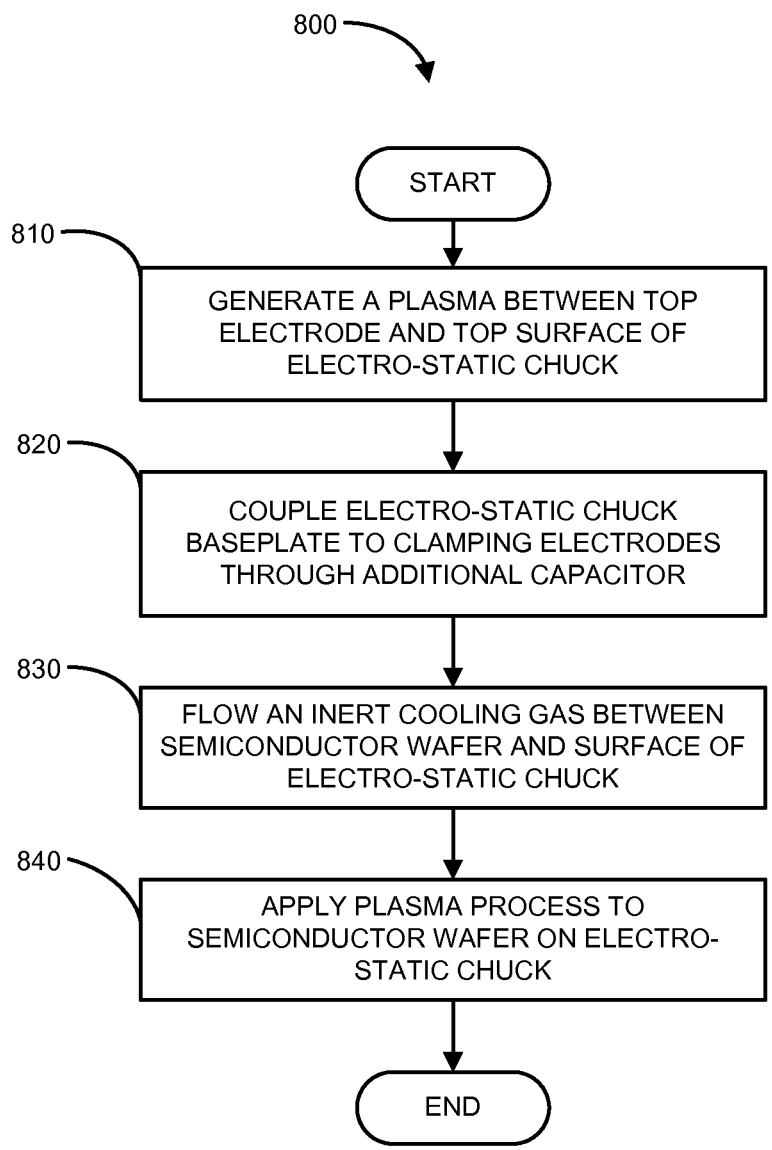
FIG. 8 is a flowchart diagram that illustrates the method operations performed in reducing arcing between the semiconductor wafer and the electrostatic chuck, in accordance with embodiments of the present invention.

FIG. 8 is a flowchart diagram that illustrates the method operations 800 performed in reducing arcing between the semiconductor wafer and the electrostatic chuck 104, in accordance with embodiments of the present invention. The operations illustrated herein are by way of example, as it should be understood that some operations may have sub-operations and in other instances, certain operations described herein may not be included in the illustrated operations. With this in mind, the method and operations 800 will now be described.

In an operation 810, one or more RF signals from RF source(s) 120 are applied to one or both of the top electrode 106 and the electrostatic chuck 104 to generate a plasma 110 in the region between the top electrode 106 and the top surface 105 of the electrostatic chuck.

In an operation 820, the base plate 104B of the electrostatic chuck 104 is electrically coupled to the clamping electrodes 104G, 104G' through additional capacitor 250.

In an operation 830, an inert cooling gas is flowed between the semiconductor wafer 102 and the surface 104A of the electro-static chuck 104. The inert cooling gas can be Helium or similar inert cooling gas. The inert cooling gas can be injected between the semiconductor wafer 102 and the surface 104A of the electro-static chuck 104 through a one or more lift pin holes 612A and/or one or more cooling gas holes 612B. The one or more lift pin holes 612A and/or one or more cooling gas holes 612B are fluidly coupled to a cooling gas distribution system (e.g., conduits, plenums, etc.) within the electro-static chuck. The cooling gas distribution system is coupled to a cooling gas source.

In an operation 840, a plasma process is applied to the semiconductor wafer 102 on the electro-static chuck 104. The method operations can end when the plasma process is completed.

Figure 9:
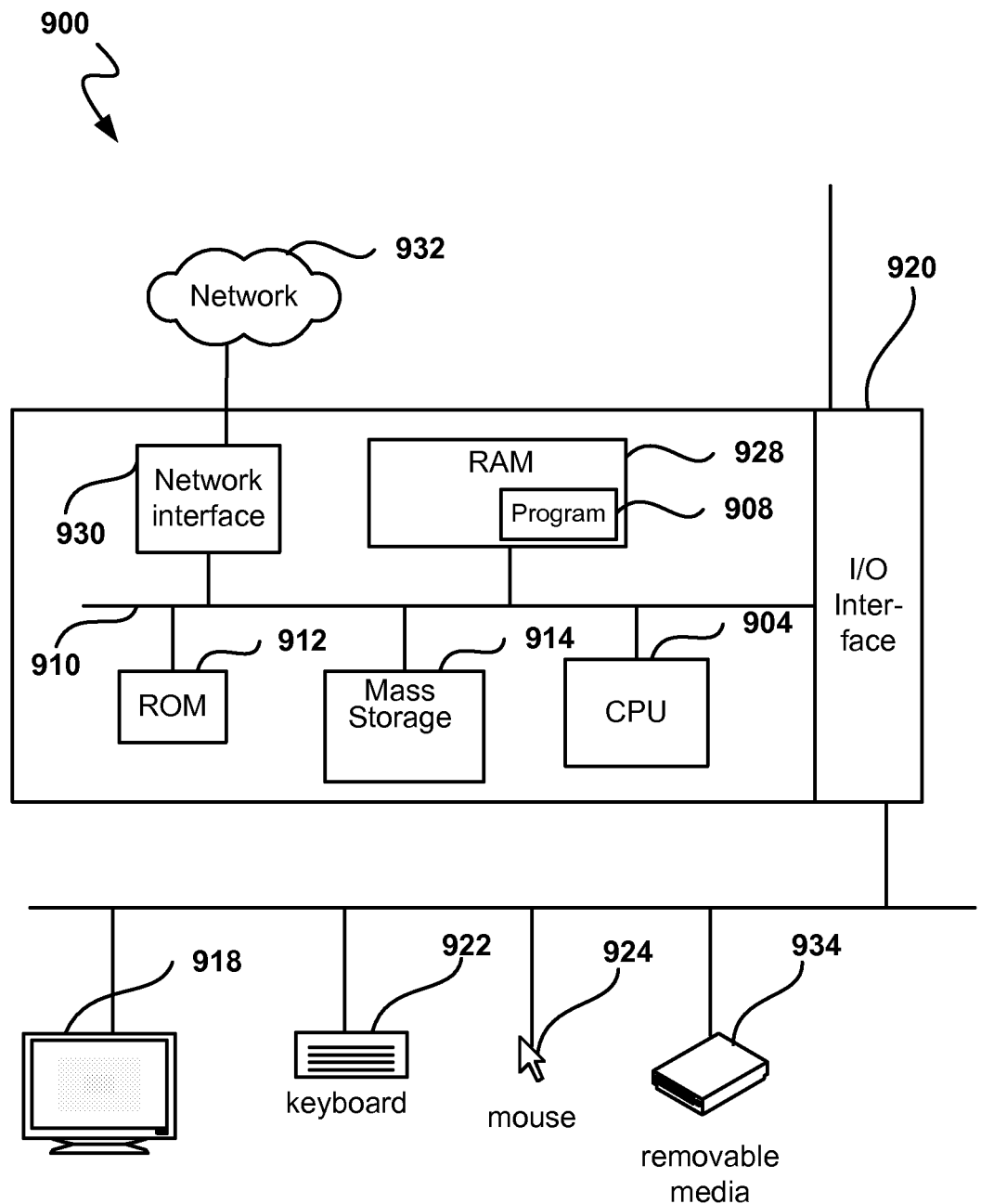
FIG. 9 is a block diagram of an exemplary computer system for carrying out the processing according to the invention.

FIG. 9 is a block diagram of an exemplary computer system 900 for carrying out the processing according to the invention. The computer system 900 is an exemplary computer system such as may be included in the controller 103, described above. The computer system 900 includes a central processing unit 904, a display screen (or monitor) 918, a printer 906, a floppy disk/optical/flash or other removable media drive 934, a mass storage device 914 (e.g., one or more hard disk drives or solid state drives), a network interface 930, a keyboard 922.

The computer 900 also includes a memory bus 910, random access memory (RAM) 928, read only memory (ROM) 912, an IO interface 920. The computer 900 can be a personal computer (such as an IBM compatible personal computer, a Macintosh computer or Macintosh compatible computer), a workstation computer (such as a Sun Microsystems or Hewlett-Packard workstation), or some other type of computer.

The CPU 904 is a general purpose digital processor, which controls the operation of the computer system 900. The CPU 904 can be a single-chip processor or can be implemented with multiple components. Using program instructions 908 retrieved from memory, the CPU 904 controls the reception and manipulation of input data and the output and display of data on output devices.

The bus 910 is used by the CPU 904 to access the RAM 928 and the ROM 912. The RAM 928 is used by the CPU 904 as a general storage area and as scratch-pad memory, and can also be used to store input data and processed data. The ROM 912 can be used to store instructions or program code followed by the CPU 904 as well as other data.

The I/O interface 920 is used to access the input, output, and storage devices used by the computer 900. In the described embodiment, these devices include the display screen 918, the floppy disk/optical/flash/removable media drive 922, and the network interface 930.

The display screen 918 is an output device that displays images of data provided by the CPU 904 via the I/O interface 920 or provided by other components in the computer system 900. Other output devices such as a printer, plotter, typesetter, etc. can also be used.

The floppy disk/optical/flash/ or other removable media drive 934 and the mass storage 914 can be used to store various types of data. The floppy disk/optical/flash or other removable media drive 934 facilitates transporting such data to other computer systems, and mass storage 914 permits fast access to large amounts of stored data.

The CPU 904 together with an operating system operate to execute computer program instructions or code 908 and produce and use data. The computer program instructions or code 908 and data may reside on the RAM 928, the ROM 912, or the mass storage 914.

The computer program instructions or code 908 and data could also reside on a removable program medium and loaded or installed onto the computer system 900 when needed. Removable program media include, for example, CD-ROM, PC-CARD, floppy disk, flash memory, optical media and magnetic tape.

The network interface 930 is used to send and receive data over a network connected to other computer systems. An interface card or similar device and appropriate software implemented by the CPU 904 can be used to connect the computer system 900 to an existing network and transfer data according to standard protocols.

The keyboard 918 is used by a user to input commands and other instructions to the computer system 900. Other types of user input devices can also be used in conjunction with the present invention. For example, pointing devices such as a computer mouse, a track ball, a stylus, or a tablet can be used to manipulate a pointer on a screen of a general-purpose computer.

Figure 10:
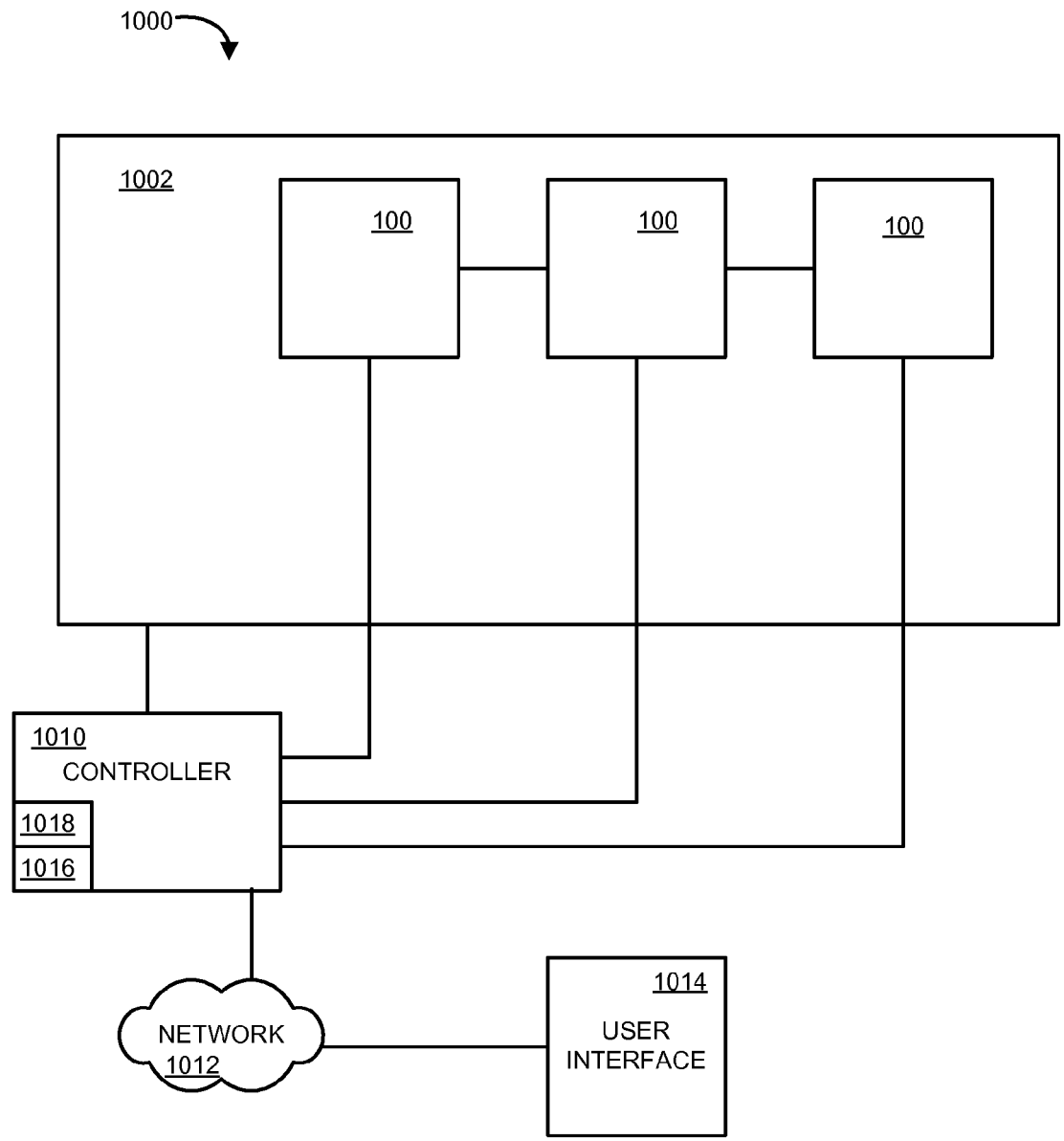
FIG. 10 is a block diagram of an integrated system including one or more of the plasma chamber systems, in accordance with embodiments of the present invention.

FIG. 10 is a block diagram of an integrated system 1000 including one or more of the plasma chamber systems 100, in accordance with embodiments of the present invention. The integrated system 1000 includes the one or more of the plasma chamber systems 100, and an integrated system controller 1010 coupled to the plasma chamber(s) in a single factory 1002. The integrated system controller 1010 includes or is coupled to (e.g., via a wired or wireless network 1012) a user interface 1014. The user interface 1014 provides user readable outputs and indications and can receive user inputs and provides user access to the integrated system controller 1010.

The integrated system controller 1010 can include a special purpose computer or a general purpose computer. The integrated system controller 1010 can execute computer programs 1016 to monitor, control and collect and store data 1018 (e.g., performance history, analysis of performance or defects, operator logs, and history, etc.) for the plasma chamber system(s) 100. By way of example, the integrated system controller 1010 can adjust the operations of the plasma chamber system(s) and/or the components therein (e.g., pressures, flow rates, bias signals, loading and unloading of the substrate 102, etc.) if data collected dictates an adjustment to the operation thereof.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A system for decoupling arcing RF signals in a plasma chamber comprising:
   a plasma chamber including:
   a top electrode;
   an electrostatic chuck for supporting a semiconductor wafer; and
   a capacitor coupled between the at least one of a plurality of clamping electrodes in the surface of the electrostatic chuck and a baseplate of the electrostatic chuck, the capacitor having a capacitance of greater than about 19 nanofarads, the capacitor disposed within an interior volume of the electrostatic chuck;
   a plurality of lift pins supported in a corresponding plurality of lift pin holes in the surface of the electrostatic chuck, wherein each one of the plurality of lift pins has a clearance of less than about 0.011 inches (0.25 mm) between a corresponding side in a corresponding one of a plurality of lift pin holes in the surface of the electrostatic chuck.

2. A system for decoupling arcing RF signals in a plasma chamber comprising:
   a plasma chamber including:
   a top electrode;
   an electrostatic chuck for supporting a semiconductor wafer; and
   a capacitor coupled between the at least one of a plurality of clamping electrodes in the surface of the electrostatic chuck and a baseplate of the electrostatic chuck, the capacitor having a capacitance of greater than about 19 nanofarads, the capacitor disposed within an interior volume of the electrostatic chuck;
   a plurality of lift pins supported in a corresponding plurality of lift pin holes in the surface of the electrostatic chuck, wherein each one of the plurality of lift pins has a clearance of less than about 0.005 inches (0.12 mm) between a corresponding side in a corresponding one of a plurality of lift pin holes in the surface of the electrostatic chuck.

3. The system of claim 1, wherein at least one of the plurality of lift pins is a round-tip lift pin.

4. The system of claim 1, wherein at least one of the plurality of lift pins is a flat tip lift pin.

5. The system of claim 1, wherein at least one of the plurality of lift pins is a broadened flat tip lift pin.

6. The system of claim 1, wherein the capacitor has a capacitance of between about 19 nanofarads and about 43 nanofarads.

7. A method of decoupling arcing RF signals in a plasma chamber comprising:
   generating a plasma in the region between a top electrode and a top surface of an electrostatic chuck in a plasma chamber including applying one or more RF signals to one or both of the top electrode and the electrostatic chuck, wherein a semiconductor wafer is supported on the top surface of an electrostatic chuck; and
   coupling a portion of the one or more RF signals through a capacitor coupled between a plurality of clamping electrodes in the top surface of the electrostatic chuck and a baseplate of the electrostatic chuck, the capacitor having a capacitance of at least 19 nanofarads, the capacitor disposed within an interior volume of the electrostatic chuck, and
   providing a plurality of lift pins in a corresponding plurality of lift pin holes in the top surface of the electrostatic chuck, wherein each one of the plurality of lift pins has a clearance of less than about 0.011 inches (0.25 mm) between a corresponding side in a corresponding one of a plurality of lift pin holes in the top surface of the electrostatic chuck.

8. The method of claim 7, wherein the capacitor has a capacitance of between about 19 nanofarads and about 43 nanofarads.

9. The method of claim 7, wherein at least one of the plurality of lift pins is a round-tip lift pin.

10. The method of claim 7, wherein at least one of the plurality of lift pins is a flat tip lift pin.

11. The method of claim 7, wherein at least one of the plurality of lift pins is a broadened flat tip lift pin.

12. A system for decoupling arcing RF signals in a plasma chamber comprising:
    a plasma chamber including:
    a top electrode;
    an electrostatic chuck for supporting a semiconductor wafer;
    a capacitor coupled between the at least one of a plurality of clamping electrodes in the surface of the electrostatic chuck and a baseplate of the electrostatic chuck, the capacitor having a capacitance of between about 19 nanofarads and about 43 nanofarads, the capacitor disposed within an interior volume of the electrostatic chuck; and
    a plurality of lift pins supported in a corresponding plurality of lift pin holes in the surface of the electrostatic chuck, wherein each one of the plurality of lift pins has a clearance of less than about 0.005 inches (0.12 mm) between a corresponding side in a corresponding one of a plurality of lift pin holes in the surface of the electrostatic chuck.

13. The system of claim 1, wherein the RF signals provided to the plasma chamber are at a frequency of about 400 KHz.

14. The system of claim 2, wherein the RF signals provided to the plasma chamber are at a frequency of about 400 KHz.

15. The method of claim 7, wherein the RF signals provided to the plasma chamber are at a frequency of about 400 KHz.

16. The method of claim 12, wherein the RF signals provided to the plasma chamber are at a frequency of about 400 KHz.

* * * * *